US008575950B2

(12) United States Patent
Chen et al.

(10) Patent No.: US 8,575,950 B2
(45) Date of Patent: Nov. 5, 2013

(54) STATIC/DYNAMIC RESISTANCE MEASURING APPARATUS AND METHOD

(75) Inventors: Jiankang Chen, Ningbo (CN); Jintao Lei, Ningbo (CN); Minghua Zhang, Ningbo (CN)

(73) Assignee: Ningbo University, Ningbo, Zhejiang Province (CN)

( * ) Notice: Subject to any disclaimer, the term of this patent is extended or adjusted under 35 U.S.C. 154(b) by 435 days.

(21) Appl. No.: 12/915,621

(22) Filed: Oct. 29, 2010

(65) Prior Publication Data

US 2012/0105083 A1 May 3, 2012

(51) Int. Cl.
*G01R 27/08* (2006.01)

(52) U.S. Cl.
USPC ............... 324/691; 324/98; 324/706

(58) Field of Classification Search
USPC ............ 324/691, 705, 706; 323/367
See application file for complete search history.

(56) References Cited

U.S. PATENT DOCUMENTS

| | | | | | |
|---|---|---|---|---|---|
| 2,951,200 | A | * | 8/1960 | Critchlow | 324/601 |
| 2,965,842 | A | * | 12/1960 | Jacobson | 324/701 |
| 3,006,185 | A | * | 10/1961 | Huggenberger | 73/771 |
| 3,602,952 | A | * | 9/1971 | Grinnell et al. | 324/706 |
| 4,034,291 | A | * | 7/1977 | Allen et al. | 324/121 R |
| 5,159,209 | A | * | 10/1992 | Gleeson, III | 326/30 |
| H1793 | H | * | 4/1999 | Peterson et al. | 323/367 |
| 2002/0147554 | A1 | * | 10/2002 | Pickerd | 702/66 |

* cited by examiner

*Primary Examiner* — Arleen M Vazquez
*Assistant Examiner* — Hoang X Nguyen

(57) ABSTRACT

A resistance measuring apparatus which includes a variable voltage source, a signal display circuit, a bridge consisting of a first standard resistor, a second standard resistor, an adjustable resistor and the unknown resistor, a bridge balance display circuit and a dynamic voltage display circuit alternatively connected within the bridge. The resistance measuring apparatus is adapted to measure static resistance and dynamic resistance variation of an unknown resistor in the case of external environment having changed dramatically.

13 Claims, 5 Drawing Sheets

STATIC/DYNAMIC RESISTANCE MEASURING APPARATUS AND METHOD

BACKGROUND OF THE PRESENT INVENTION

1. Field of Invention

The present invention relates to resistance measuring filed, and more particularly to a resistance measuring apparatus for measuring static resistance and dynamic resistance variation and its method.

2. Description of Related Arts

At present according to different volume resistivity $\rho$, there are two methods for measuring resistance. When $\rho<10^8 \Omega \cdot cm$, a normal intelligent digital multimeter is enough to measure resistance, while when $\rho>10^8 \Omega \cdot cm$, an ultra-high resistance meter is needed to measure resistance. This means, when the external environment (load, temperature, humidity, corrosion, aging, etc.) has changed dramatically, the resistance of a material will change greatly, even that the order of magnitude of the resistance changes greatly. In this case, two different apparatus are needed to measure the resistance. However, during measurement process, changing measuring apparatus not just results in more operation, but needs time interval. Therefore, for a same material, these shortcomings will lead to error in resistance measurement.

With the rapid development of aerospace industry, the researches on new material with lightweight and shielding properties have advanced. Research staff are focusing on polypropylene, polyaniline and other polymers. After adding conductive particles, the electrical properties of these polymer materials have very important significances to study the internal mechanism of the material conductivity under loading. In order to measure the resistance of these materials, the ultra-high resistance meter is usually used. However, the actual result of measurement is not satisfactory. Limited by internal circuit structure of the ultra-high resistance meter, only a roughly resistance value can be gained, and the gained roughly value often has a large deviation, Therefore, accuracy measurement is a problem to be solved.

In a relatively short period of time, when loading on the measured object, the measured physical quantity of the measured object will generate a fast and great variation. Then, write down this variation. If the measured physical quantity is the resistance of the measured object, the above measurement process is called dynamic measurement of the resistance. At present, the existing resistance measurement apparatus is mainly used for static measurement, and not able to take a dynamic measurement by reason that the dynamic load variation is too short to be measured (required measurement frequency is 1 per second). That is, the dynamic load variation is already finished before the resistance measurement apparatus to acquire related data. Up to now, dynamic measurement of the resistance is still a problem remaining to be solved.

SUMMARY OF THE PRESENT INVENTION

An object of the present invention is to provide a resistance measuring apparatus for measuring static resistance and dynamic resistance variation, which can measure not only the static resistance but also the dynamic resistance variation in the case of external environment having changed dramatically.

Another object of the present invention is to provide a resistance measuring apparatus for measuring static resistance and dynamic resistance variation which can measure not only the lower order of magnitude of resistance but also the higher order of magnitude of resistance, so as that for a material whose order of magnitude of the resistance changes greatly changes in the case of external environment having changed dramatically, the resistance measuring apparatus provided by the present invention can achieve to measure it continuously.

Another object of the present invention is to provide a method of measuring the dynamic resistance variation of an unknown resistor by the above resistance measuring apparatus.

Accordingly, in order to accomplish the above objects, the present invention provides a resistance measuring apparatus for measuring static resistance and dynamic resistance variation of an unknown resistor, comprising:

a variable voltage source;

a signal display circuit connected with the variable voltage source for displaying source voltage signal;

a first standard resistor and an adjustable resistor are respectively connected with the signal display circuit;

a second standard resistor connected with the adjustable resistor, wherein the unknown resistor is connected between the first standard resistor and the second standard resistor;

a fifth option switch having a stationary contact and two moving contacts, wherein the stationary contact is connected with a connecting point of the first standard resistor and the adjustable resistor;

a bridge balance display circuit and a dynamic voltage display circuit are alternatively connected between the connecting point of the first standard resistor and the adjustable resistor and a connecting point of the unknown resistor and the second standard resistor by the fifth option switch, wherein one terminal of the bridge balance display circuit and one terminal of the dynamic voltage display circuit are respectively connected with two moving contacts of the fifth option switch, while another terminal of the bridge balance display circuit and another terminal of the dynamic voltage display circuit are both connected with the connecting point of the unknown resistor and the second standard resistor.

A method of measuring the dynamic resistance variation of the unknown resistor by the resistance measuring apparatus comprises the steps of:

(a) connecting two electrodes with two side of the unknown resistor;

(b) connecting the unknown resistor between the first standard resistor and the second standard resistor;

(c) taking the unknown resistor into a Split Hopkinson Pressure Bar device, which comprises a impact bar, an entrance bar, a transmission bar, an absorption bar, and a damper;

(d) selecting the bridge balance display circuit to be electrically connected by turning the fifth option switch;

(e) adjusting the output of the variable voltage source to a desired value;

(f) adjusting the resistance of the adjustable resistor until the bridge balance display circuit displaying bridge balance, which means a bridge comprising the first standard resistor, the adjustable resistor, the second standard resistor and the unknown resistor is balance;

(g) measuring out the resistance of the adjustable resistor, whereby the resistance of the unknown resistor is measured from the equation: the resistance of the unknown resistor=the resistance of the first standard resistor*the resistance of the first standard resistor/the resistance of the adjustable resistor;

(h) selecting the dynamic voltage display circuit to be electrically connected by turning the fifth option switch;

(i) starting the Split Hopkinson Pressure Bar device, wherein the impact bar impacts the entrance bar, then the entrance bar acts on the unknown resistor, then the unknown resistor acts on the transmission bar, then the transmission bar acts on the absorption bar, at last the absorption bar impacts the damper, wherein the damper contributes to buffer and energy absorption;

(j) recording an voltage variation curve displayed on the dynamic voltage display circuit; and (k) converting the voltage variation curve into the an resistance variation curve of the unknown resistor according to conversion formulas between voltage and resistance.

These and other objectives, features, and advantages of the present invention will become apparent from the following detailed description, the accompanying drawings, and the appended claims.

DETAILED DESCRIPTION OF THE PREFERRED EMBODIMENT

Figure 1:
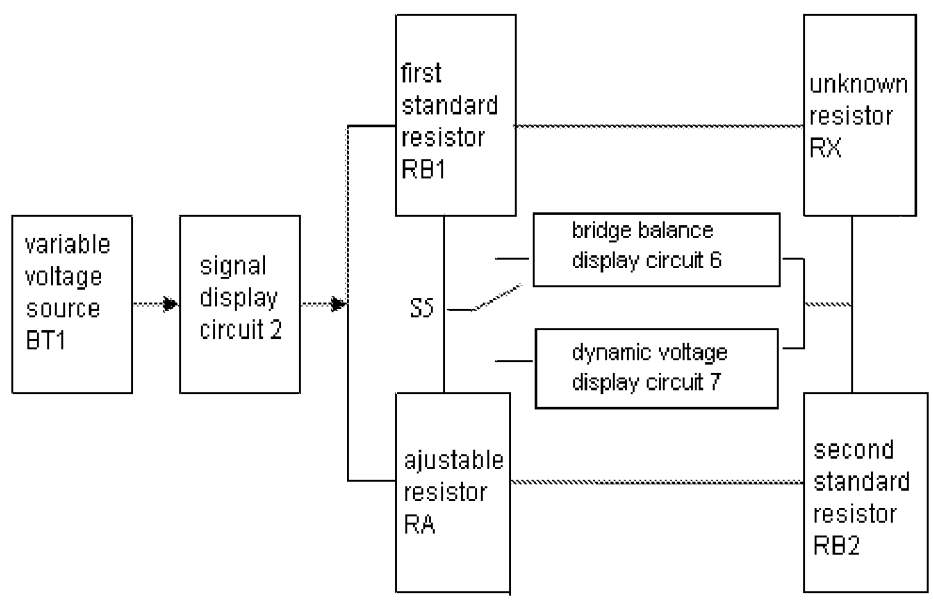
FIG. 1 is a circuit block diagram of a resistance measuring apparatus of the present invention.

Referring to FIG. 1 of the drawings, a resistance measuring apparatus for measuring static resistance and dynamic resistance variation of an unknown resistor RX according to a preferred embodiment of the present invention is illustrated, in which the resistance measuring apparatus comprising a variable voltage source BT1; a signal display circuit 2 connected with the variable voltage source BT1; a first standard resistor RB1; an adjustable resistor RA; a second standard resistor RB2; a bridge balance display circuit 6; a dynamic voltage display circuit 7; and a fifth option switch S5 having a stationary contact and two moving contacts, wherein the signal display circuit 2 is respectively connected with the first standard resistor RB2 and the adjustable resistor RA, the second standard resistor RB2 is connected with the adjustable resistor RA, the unknown resistor RX is connected between the first standard resistor RB1 and the second standard resistor RB2.

The stationary contact of the fifth option switch S5 is connected with a connecting point of the first standard resistor RB1 and the adjustable resistor RA, while two moving contacts of the fifth option switch S5 are respectively connected with one terminal of the bridge balance display circuit 6 and one terminal of the dynamic voltage display circuit 7. Another terminal of the bridge balance display circuit 6 and another terminal of the dynamic voltage display circuit 7 are both connected with a connecting point of the unknown resistor RX and the second standard resistor RB2.

That is, the bridge balance display circuit 6 and the dynamic voltage display circuit 7 are alternatively connected between the connecting point of the first standard resistor RB1 and the adjustable resistor RA and the connecting point of the unknown resistor RX and the second standard resistor RB2 by the fifth option switch S5. When the bridge balance display circuit 6 is connected between the connecting point of the first standard resistor RB1 and the adjustable resistor RA and the connecting point of the unknown resistor RX and the second standard resistor RB2 by the fifth option switch S5, the resistance measuring apparatus is adapted to measure the static resistance of the unknown resistor RX; when the dynamic voltage display circuit 7 is connected between the connecting point of the first standard resistor RB1 and the adjustable resistor RA and the connecting point of the unknown resistor RX and the second standard resistor RB2 by the fifth option switch S5, the resistance measuring apparatus is adapted to measure the dynamic resistance variation of the unknown resistor RX.

Figure 2:
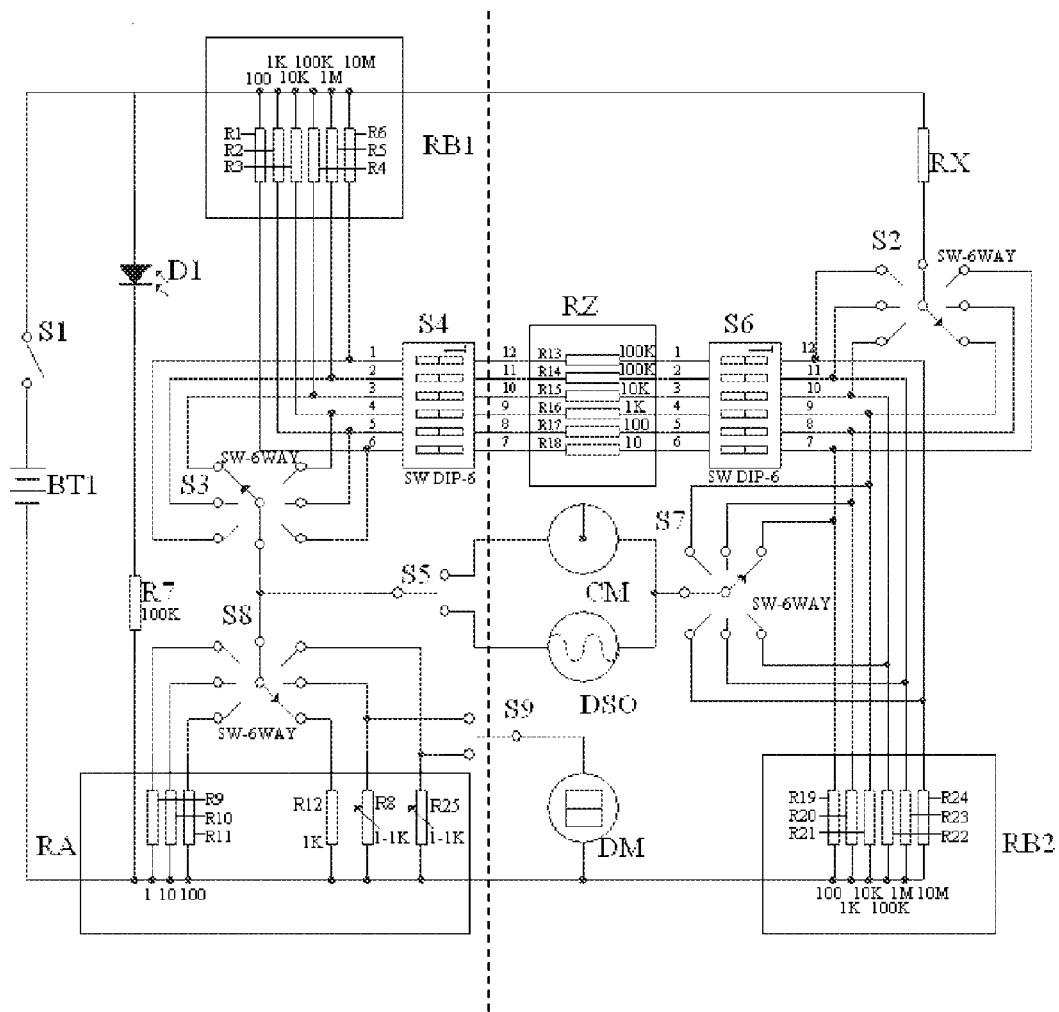
FIG. 2 is a circuit diagram of the resistance measuring apparatus according to a preferred embodiment of the present invention.
Figure 2A:
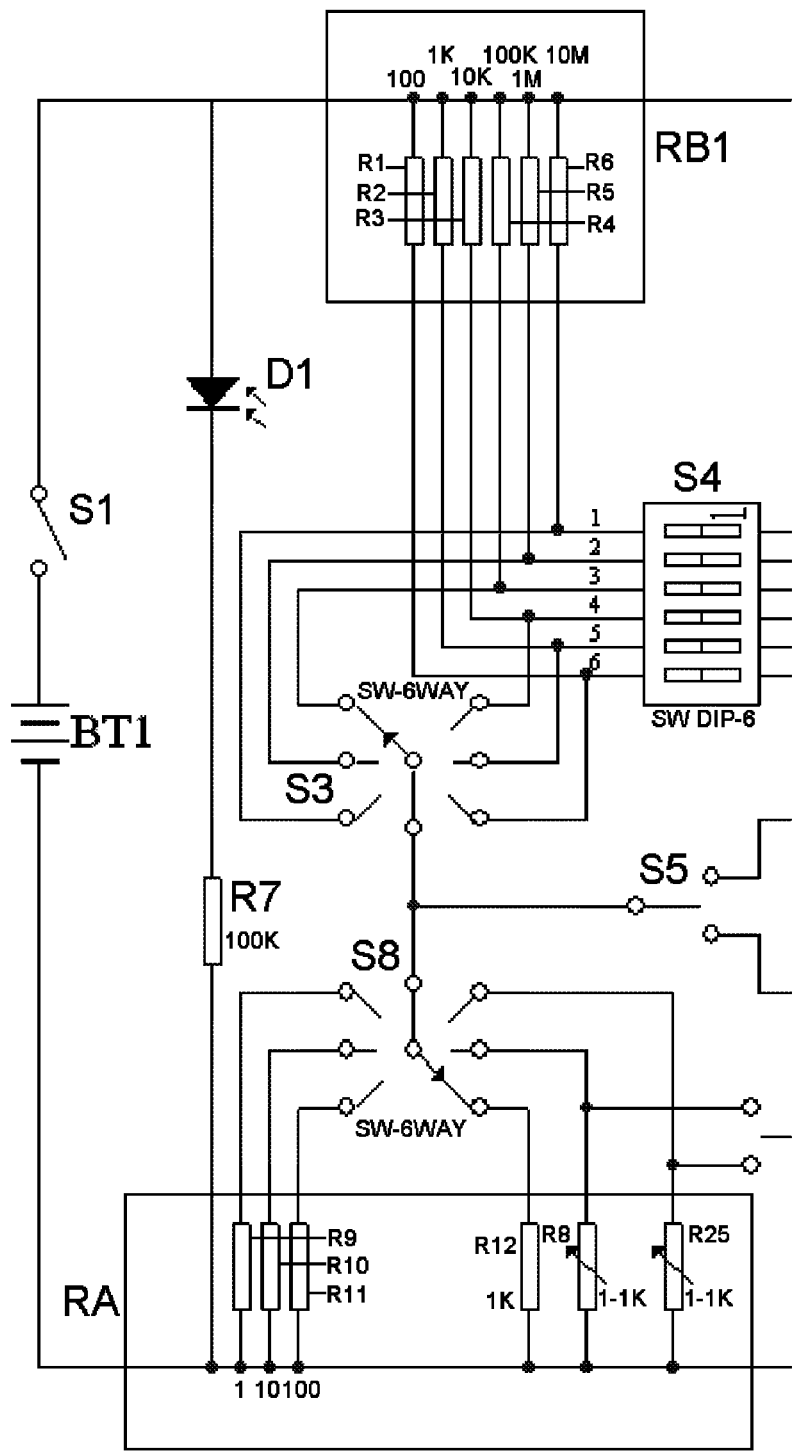
FIG. 2A-2B are enlarge diagrams of the FIG. 2
Figure 2B:
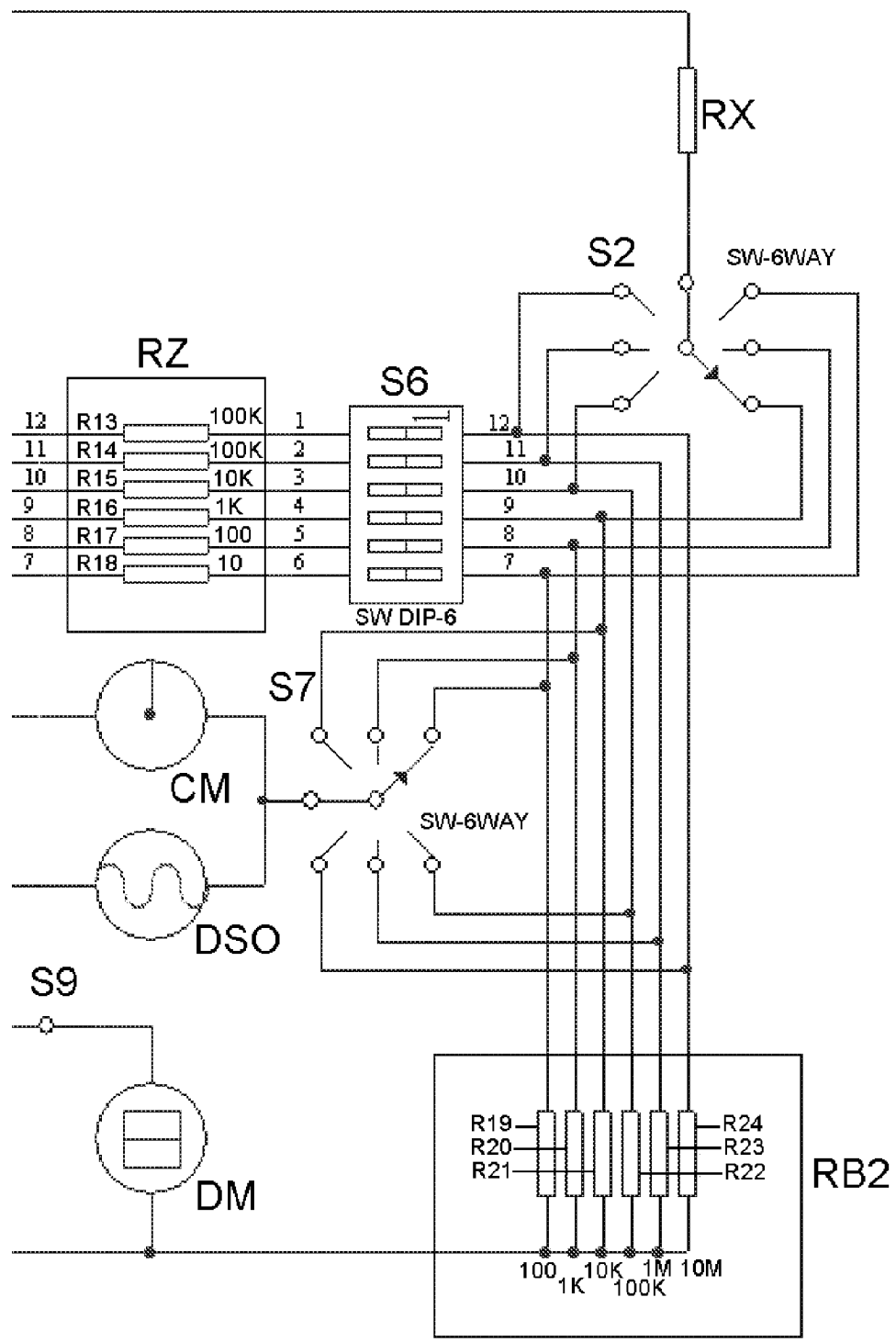
Figure 3:
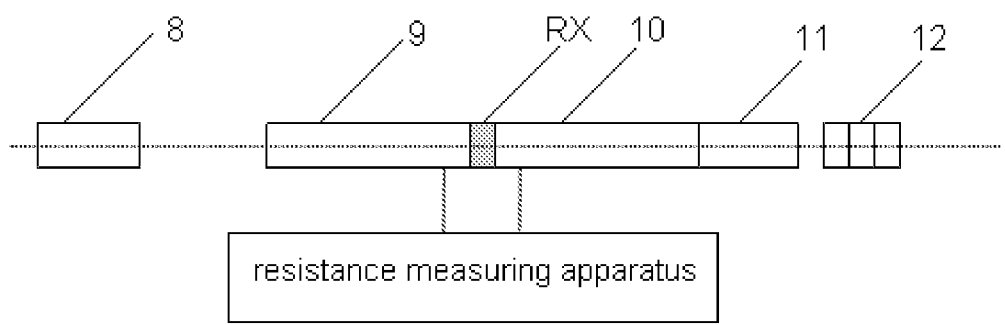
FIG. 3 is a schematic diagram of measuring the dynamic resistance variation of the unknown resistor.

Referring to the FIG. 2, and FIG. 2A-2B of the drawings, a first switch S1 is connected with one pole of the variable voltage source BT1. The signal display circuit 2 comprises a light emitting diode D1 and a seventh resistor R7 series connected between the first switch S1 and another pole of the variable voltage source BT1. The signal display circuit 2 is adapted to display source voltage signal, so as to show the current voltage value and check whether the circuit is electrified or not.

The balance display circuit 6 comprises a first multi-channel DIP (dual in-line package) switch S4; an optional resistor RZ comprising a plurality of selectable resistors for providing various orders of magnitude of resistances; a second multi-channel DIP switch S6; and a current meter CM, wherein the first multi-channel DIP switch S4 is connected with the connecting point of the first standard resistor RB1 and the adjustable resistor RA, while the second multi-channel DIP switch S6 is connected with the connecting point of the unknown resistor RX and the second standard resistor RB2, wherein the optional resistor RZ is connected between the first multi-channel DIP switch S4 and the second multi-channel DIP switch S6.

The dynamic voltage display circuit 7 comprises the first multi-channel DIP switch S4; the optional resistor RZ; the second multi-channel DIP switch S6; and a digital storage oscilloscope DSO, wherein the first multi-channel DIP switch S4 is connected with the connecting point of the first standard resistor RB1 and the adjustable resistor RA, while the second multi-channel DIP switch S6 is connected with the connecting point of the unknown resistor RX and the second standard resistor RB2, wherein the optional resistor RZ is connected between the first multi-channel DIP switch S4 and the second multi-channel DIP switch S6.

One terminal of the current meter CM and one terminal of the digital storage oscilloscope DSO are respectively connected with two moving contacts of the fifth option switch S5. Another terminal of the current meter CM and another terminal of the digital storage oscilloscope DSO are both connected with the connecting point of the unknown resistor RX and the second standard resistor RB2. That is, the current meter CM and the digital storage oscilloscope DSO are alternatively connected between the connecting point of the first standard resistor RB1 and the adjustable resistor RA and the connecting point of the unknown resistor RX and the second standard resistor RB2 by the fifth option switch S5.

Therefore, according to the preferred embodiment of the present invention, the bridge balance display circuit 6 and the dynamic voltage display circuit 7 alternatively connecting between the connecting point of the first standard resistor RB1 and the adjustable resistor RA and the connecting point of the unknown resistor RX and the second standard resistor RB2 is embodied by alternatively connecting the current meter CM and the digital storage oscilloscope DSO between the connecting point of the first standard resistor RB1 and the adjustable resistor RA and the connecting point of the unknown resistor RX and the second standard resistor RB2.

When the current meter CM is connected between the connecting point of the first standard resistor RB1 and the adjustable resistor RA and the connecting point of the unknown resistor RX and the second standard resistor RB2 by the fifth option switch S5, the resistance measuring apparatus is adapted to measure the static resistance of the unknown resistor RX; when the digital storage oscilloscope DSO is connected between the connecting point of the first standard resistor RB1 and the adjustable resistor RA and the connecting point of the unknown resistor RX and the second standard resistor RB2 by the fifth option switch S5, the resistance measuring apparatus is adapted to measure the dynamic resistance variation of the unknown resistor RX.

Preferably, the digital storage oscilloscope DSO is a digital phosphor oscilloscope.

The adjustable resistor RA comprises a fine-adjustment resistor R8 having a resistance range from 1 to 1K ohms and a coarse-adjustment resistor R25 having a resistance range from 1 to 10K ohms According to the preferred embodiment of the present invention, the resistance measuring apparatus further comprise a digital multimeter DM, wherein the fine-adjustment resistor R8 and the coarse-adjustment resistor R25 are alternatively connected with the digital multimeter DM by a ninth option switch S9.

The first standard resistor RB1, the second standard resistor RB2, and the adjustable resistor RA all comprise a plurality of selectable resistors for providing various orders of magnitude of resistances, so that a user can conveniently select his desired resistance to meet different demands.

The resistance measuring apparatus further comprise a third multi-channel option switch S3, a second multi-channel option switch S2, an eighth multi-channel option switch S8 respectively connected with the selectable resistors of the first standard resistor RB1, the selectable resistors of the second standard resistor RB2, and the selectable resistors of the adjustable resistor RA and the fine-adjustment resistor R8 and the coarse-adjustment resistor R25; and a seventh multi-channel option switch S7 connected between an connecting point of the current meter CM and the digital storage oscilloscope DSO and the connecting point of the unknown resistor RX and the second standard resistor RB2.

According to the preferred embodiment of the present invention, the first standard resistor RB1 comprises a first resistor R1 having a resistance of 100 ohms; a second resistor R2 having a resistance of 1K ohms; a third resistor R3 having a resistance of 10K ohms; a fourth resistor R4 having a resistance of 100K ohms; a fifth resistor R5 having a resistance of 1M ohms; a sixth resistor R6 having a resistance of 10M ohms The optional resistor RZ comprises a thirteenth resistor R13 having a resistance of 100K ohms; a fourteenth resistor R14 having a resistance of 100K ohms; a fifteenth resistor R15 having a resistance of 10K ohms; a sixteenth resistor R16 having a resistance of 1K ohms; a seventeenth resistor R17 having a resistance of 100 ohms; an eighteenth resistor R18 having a resistance of 10 ohms The second standard resistor RB2 comprises a nineteen resistor R19 having a resistance of 100 ohms; a twentieth resistor R20 having a resistance of 1K ohms; a twenty-first resistor R21 having a resistance of 10K ohms; a twenty-second resistor R22 having a resistance of 100K ohms; a twenty-third resistor R23 having a resistance of 1M ohms; a twenty-fourth resistor R24 having a resistance of 10M ohms The adjustable resistor RA further comprises a ninth resistor R9 having a resistance of 1 ohm; a tenth resistor R10 having a resistance of 10 ohms; an eleventh resistor R11 having a resistance of 100 ohms; a twelfth resistor R12 having a resistance of 1K ohms According to the preferred embodiment of the present invention, the first multi-channel DIP switch S4 and the second multi-channel DIP switch S6 are six-channel DIP switch; the third multi-channel option switch S3, the second multi-channel option switch S2, the eighth multi-channel option switch S8, and the seventh multi-channel option switch S7 are six-channel option switch.

A method of measuring the static resistance of the unknown resistor RX by the above resistance measuring apparatus comprises the steps of:

(a) connecting two electrodes with two side of the unknown resistor RX;

(b) connecting the unknown resistor RX between the second multi-channel option switch S2 and the first standard resistor RB1;

(c) selecting one selectable resistor (e.g. the sixth resistor R6) of the first standard resistor RB1 to be electrically connected by turning the third multi-channel option switch S3, selecting one selectable resistor (e.g. the thirteenth resistor R13) of the optional resistor RZ to be electrically connected by turning the first multi-channel DIP switch S4 and the second multi-channel DIP switch S6, selecting one selectable resistor (e.g. the twenty-fourth resistor R24) of the second standard resistor RB2 to be electrically connected by turning the second multi-channel option switch S2, selecting the coarse-adjustment resistor R25 of the adjustable resistor RA to be electrically connected by turning the eighth multi-channel option switch S8, selecting the current meter CM to be electrically connected by turning the fifth option switch S5 and the seventh option switch S7;

(d) adjusting the output of the variable voltage source BT1 to a desired value (e.g. 10V), and closing the first switch S1;

(e) adjusting the resistance of the coarse-adjustment resistor R25 until the reading of the current meter CM is zero;

(f) selecting the fine-adjustment resistor R8 of the adjustable resistor RA to be electrically connected by turning the eighth multi-channel option switch S8; adjusting the resistance of the fine-adjustment resistor R8 until the reading of the current meter CM is zero, which means a bridge which comprises the first standard resistor RB1 (i.e. the sixth resistor R6), the adjustable resistor RA (i.e. the fine-adjustment resistor R8), the second standard resistor RB2 (i.e. the twenty-fourth resistor R24) and the unknown resistor RX is balance;

(g) selecting the digital multimeter DM to be electrically connected with the fine-adjustment resister R8 by turning the ninth option switch S9 to measure out the resistance of the fine-adjustment resister R8, whereby the resistance of the unknown resistor RX is measured from the equation: RX=RB1*RB2/RA (i.e. RX=R6*R24/R8).

A method of measuring the dynamic resistance variation of the unknown resistor RX by the above resistance measuring apparatus comprises the steps of:

(a) connecting two electrodes with two side of the unknown resistor RX;

(b) connecting the unknown resistor RX between the second multi-channel option switch S2 and the first standard resistor RB1;

(c) taking the unknown resistor RX into a Split Hopkinson Pressure Bar (SHPB) device, which comprises a impact bar 8, an entrance bar 9, a transmission bar 10, an absorption bar 11, and a damper 12;

(d) selecting one selectable resistor (e.g. the fifth resistor R5) of the first standard resistor RB1 to be electrically connected by turning the third multi-channel option switch S3, selecting one selectable resistor (e.g. the fourteenth resistor R14) of the optional resistor RZ to be electrically connected by turning the first multi-channel DIP switch S4 and the second multi-channel DIP switch S6, selecting one selectable resistor (e.g. the twenty-third resistor R23) of the second standard resistor RB2 to be electrically connected by turning the second multi-channel option switch S2, selecting the coarse-adjustment resistor R25 of the adjustable resistor RA to be electrically connected by turning the eighth multi-channel option switch S8, selecting the current meter CM to be electrically connected by turning the fifth option switch S5 and the seventh option switch S7;

(e) adjusting the output of the variable voltage source BT1 to a desired value (e.g. 100V), and closing the first switch 51;

(f) adjusting the resistance of the coarse-adjustment resistor R25 until the reading of the current meter CM is zero;

(g) selecting the fine-adjustment resistor R8 of the adjustable resistor RA to be electrically connected by turning the eighth multi-channel option switch S8; adjusting the resistance of the fine-adjustment resistor R8 until the reading of the current meter is zero, which means a bridge which comprises the first standard resistor RB1 (i.e. the fifth resistor R5), the adjustable resistor RA (i.e. the fine-adjustment resistor R8), the second standard resistor RB2 (i.e. the twenty-third resistor R23) and the unknown resistor RX is balance;

(h) selecting the digital multimeter DM to be electrically connected with the fine-adjustment resister R8 by turning the ninth option switch S9 to measure out the resistance of the fine-adjustment resister R8, whereby the resistance of the unknown resistor RX is measured from the equation: RX=RB1*RB2/RA (i.e. RX=R5*R23/R8);

(i) selecting the digital storage oscilloscope DSO to be electrically connected by turning the fifth option switch S5;

(j) selecting one selectable resistor of the adjustable resistor RA to be electrically connected by turning the eighth option switch S8, wherein the selectable resistor has a resistance nearest to the orders of magnitude of the fine-adjustment resistor R8 for prevent the fine-adjustment resistor R8 from destroying by great current;

(k) starting the Split Hopkinson Pressure Bar device, wherein the impact bar 8 impacts the entrance bar 9, then the entrance bar 9 acts on the unknown resistor RX, then the unknown resistor RX acts on the transmission bar 10, then the transmission bar 10 acts on the absorption bar 11, at last the absorption bar 11 impacts the damper 12, wherein the damper contributes to buffer and energy absorption;

(l) recording the voltage variation curve displayed on the digital storage oscilloscope DSO;

(m) converting the voltage variation curve into an resistance variation curve of the unknown resistor RX according to the conversion formulas between voltage and resistance.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A method of measuring a dynamic resistance variation of an unknown resistor, comprising the steps of:
    (a) respectively connecting two electrodes with two sides of the unknown resistor;
    (b) connecting the unknown resistor with the electrodes between a second multi-channel option switch and a first standard resistor;
    (c) after step (b), taking the unknown resistor into a Split Hopkinson Pressure Bar device;
    (d) adjusting a third multi-channel option switch for selecting one selectable resistor of the first standard resistor to be electrically connected, adjusting a first multi-channel DIP switch and a second multi-channel DIP switch for selecting one selectable resistor of a resistance box to be electrically connected, adjusting the second multi-channel option switch for selecting one selectable resistor of a second standard resistor to be electrically connected, adjusting an eighth multi-channel option switch for selecting a coarse-adjustment resistor of an adjustable resistor to be electrically connected, adjusting a fifth option switch and a seventh option switch for selecting a current meter to be electrically connected;
    (e) adjusting an output of a variable voltage source to a desired value, and closing a first switch;
    (f) adjusting a resistance of the coarse-adjustment resistor till a reading of the current meter is zero;
    (g) adjusting the eighth multi-channel option switch for selecting a fine-adjustment resistor of the adjustable resistor to be electrically connected; adjusting a resistance of the fine-adjustment resistor till the reading of the current meter is zero to reach a bridge balance;
    (h) adjusting a ninth multi-channel option switch for selecting a digital multimeter to be electrically connected with the fine-adjustment resistor to measure out the resistance of the fine-adjustment resistor, whereby a resistance of the unknown resistor is measured from a equation: the resistance of the unknown resistor=a resistance of the first standard resistor×a resistance of the second standard resistor/the resistance of the fine-adjustment resistor;
    (i) adjusting the fifth option switch for selecting a digital storage oscilloscope to be electrically connected;
    (j) selecting the eighth option switch for selecting one selectable resistor of the adjustable resistor to be electrically connected, wherein the selectable resistor has a resistance nearest to orders of magnitude of the fine-adjustment resistor for prevent the fine-adjustment resistor from destroying by great current;
    (k) starting the Split Hopkinson Pressure Bar device, wherein an impact bar impacts an entrance bar, then the entrance bar acts on the unknown resistor, then the unknown resistor acts on a transmission bar, then the transmission bar acts on an absorption bar, at last the absorption bar impacts a damper, wherein the damper contributes to buffer and energy absorption;
    (l) recording an voltage variation curve displayed on the digital storage oscilloscope; and
    (m) converting the voltage variation curve into an resistance variation curve of the unknown resistor according to conversion formulas between voltage and resistance.

2. The method, as recited in claim 1, wherein the dynamic resistance variation of the unknown resistor is measured by a resistance measuring apparatus comprising:
    a variable voltage source;
    a signal display circuit connected with the variable voltage source for displaying source voltage signals;
    a first standard resistor and an adjustable resistor respectively connected with the signal display circuit;
    a second standard resistor connected with the adjustable resistor, wherein the unknown resistor is connected between the first standard resistor and the second standard resistor;
    a fifth option switch having a stationary contact and two moving contacts, wherein the stationary contact is connected with a connecting point of the first standard resistor and the adjustable resistor; and a bridge balance display circuit and a dynamic voltage display circuit, one of which being connected between the connecting point of the first standard resistor and the adjustable resistor and a connecting point of the unknown resistor and the second standard resistor by the fifth option switch, wherein one terminal of the bridge balance display circuit and one terminal of the dynamic voltage display circuit are respectively connected with two moving contacts of the fifth option switch, while another terminal of the bridge balance display circuit and another terminal of the dynamic voltage display circuit are both connected with the connecting point of the unknown resistor and the second standard resistor.

3. The method, as recited in claim 2, wherein the resistance measuring apparatus further comprises a digital multimeter connected with the adjustable resistor for measuring a resistance of the adjustable resistor.

4. The method, as recited in claim 3, wherein the bridge balance display circuit comprises:
   a first multi-channel DIP switch connected with the connecting point of the first standard resistor and the adjustable resistor;
   a second multi-channel DIP switch connected with the connecting point of the unknown resistor and the second standard resistor;
   an resistance box comprising a plurality of selectable resistors for providing various orders of magnitude of resistances, wherein the resistance box is connected between the first multi-channel DIP switch and the second multi-channel DIP switch and controlled by the first multi-channel DIP switch and the second multi-channel DIP switch; and
   a current meter, wherein one terminal of the current meter is connected with one moving contact of the fifth option switch, another terminal of the current meter is connected with the connecting point of the unknown resistor and the second standard resistor.

5. The method, as recited in claim 4, wherein the dynamic voltage display circuit comprises a digital storage oscilloscope, and further comprises the first multi-channel DIP switch; the second multi-channel DIP switch; and the resistance box, wherein one terminal of the digital storage oscilloscope is connected with one moving contact of the fifth option switch, another terminal of the digital storage oscilloscope is connected with the connecting point of the unknown resistor and the second standard resistor.

6. The method, as recited in claim 5, wherein the adjustable resistor comprises a fine-adjustment resistor connected to the digital multimeter, and a coarse-adjustment resistor connected to the digital multimeter.

7. The method, as recited in claim 6, wherein the adjustable resistor further comprises a plurality of selectable resistors for providing various orders of magnitude of resistances.

8. The method, as recited in claim 7, wherein the first standard resistor comprises a plurality of selectable resistors for providing various orders of magnitude of resistances.

9. The method, as recited in claim 8, wherein the second standard resistor comprises a plurality of selectable resistors for providing various orders of magnitude of resistances.

10. The method, as recited in claim 9, wherein the resistance measuring apparatus further comprises a third multi-channel option switch, a second multi-channel option switch, an eighth multi-channel option switch respectively connected with the selectable resistors of the first standard resistor, the selectable resistors of the second standard resistor, the selectable resistors of the adjustable resistor and the fine-adjustment resistor and the coarse-adjustment resistor.

11. The method, as recited in claim 10, wherein the digital storage oscilloscope is a digital phosphor oscilloscope.

12. The method, as recited in claim 11, wherein the resistance measuring apparatus further comprises a first switch connected with one pole of the variable voltage source.

13. The method, as recited in claim 12, wherein the signal display circuit comprises a light emitting diode and a seventh resistor connected in series between the first switch and another pole of the variable voltage source.

* * * * *